(12) United States Patent
Hidlao et al.

(10) Patent No.: US 10,199,248 B2
(45) Date of Patent: Feb. 5, 2019

(54) INTEGRATED CIRCUIT PACKAGE SINGULATION ASSEMBLY

(71) Applicant: Texas Instruments Incorporated, Dallas, TX (US)

(72) Inventors: Arnel Jose Hidlao, Baguio (PH); Liya Aquino, Baguio (PH); Joseph Yutuc, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/352,335

(22) Filed: Nov. 15, 2016

(65) Prior Publication Data
US 2018/0138062 A1    May 17, 2018

(51) Int. Cl.
*H01L 21/67* (2006.01)
*H01L 21/687* (2006.01)
*H01L 21/683* (2006.01)
*H01L 21/66* (2006.01)

(52) U.S. Cl.
CPC .. *H01L 21/67288* (2013.01); *H01L 21/67092* (2013.01); *H01L 21/6838* (2013.01); *H01L 21/68721* (2013.01); *H01L 21/68778* (2013.01); *H01L 22/20* (2013.01); *H01L 22/12* (2013.01)

(58) Field of Classification Search
CPC ............... H01L 21/67288; H01L 21/78; H01L 21/6838; H01L 21/67092; H01L 21/68778; H01L 21/68721
See application file for complete search history.

(56) References Cited

U.S. PATENT DOCUMENTS

| | | | | |
|---|---|---|---|---|
| 6,538,313 | B1* | 3/2003 | Smith | H01L 23/3107 257/528 |
| 8,042,445 | B2* | 10/2011 | Lin | H05K 3/0044 83/128 |
| 9,159,603 | B1* | 10/2015 | Yutuc | H01L 21/6835 |
| 2003/0200855 | A1* | 10/2003 | Wing | B28D 5/0094 83/879 |

* cited by examiner

*Primary Examiner* — Kyoung Lee
*Assistant Examiner* — Christina A Sylvia
(74) *Attorney, Agent, or Firm* — Dawn Jos; Charles A. Brill; Frank D. Cimino

(57) ABSTRACT

A singulation assembly for molded leadframe sheets includes a saw chuck table having a flat upper surface with a plurality of holes therein. A vacuum source is in fluid communication with the plurality of holes. A mechanical clamping assembly operatively associated with the saw chuck table is adapted to be selectively engageable with predetermined portions of a warped molded leadframe sheet supported on the flat upper surface of the saw chuck table.

9 Claims, 5 Drawing Sheets

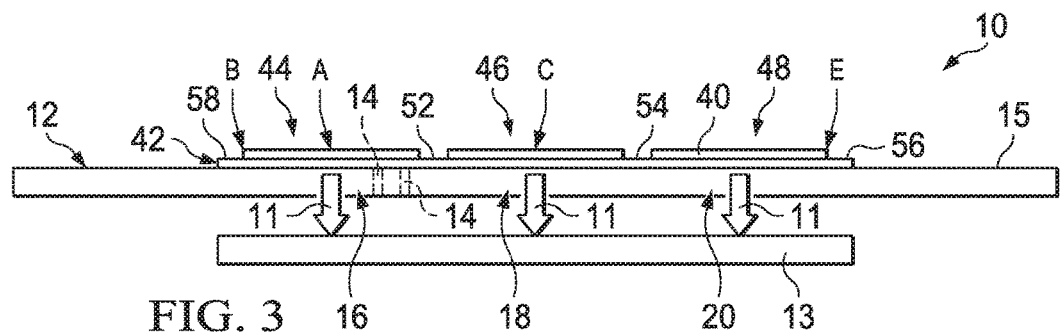
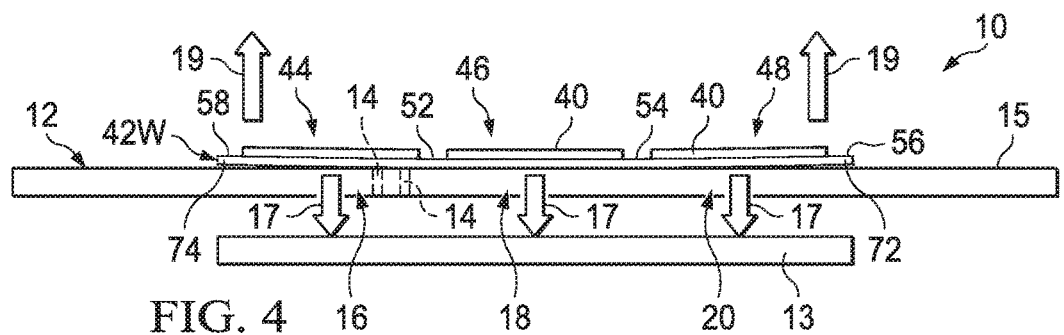
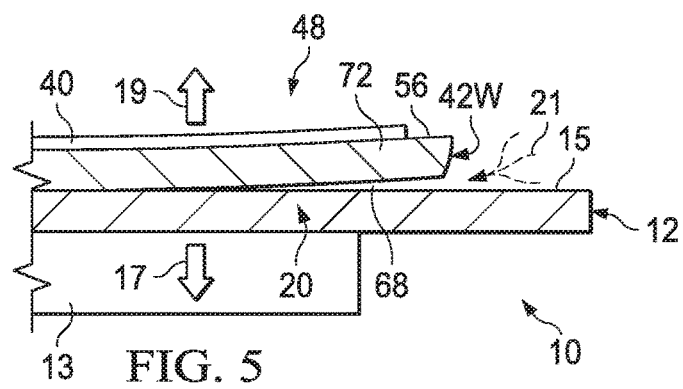

INTEGRATED CIRCUIT PACKAGE SINGULATION ASSEMBLY

BACKGROUND

The process of manufacturing integrated circuit (IC) packages generally begins with press stamping or etching of a leadframe sheet, which is generally a copper sheet. A typical leadframe sheet has several separate panels, and each panel includes an array of integrally connected leadframes. While the leadframes are still integrally connected on the leadframe sheet, integrated circuit dies are attached to each of the leadframes. These dies are then electrically attached to the corresponding leadframes, as by wire bonding.

In the next procedure, the leadframes in each panel portion of the leadframe sheet and the associated dies are encapsulated in molten mold compound. The mold compound cures to become a hard plastic block that encases the entire leadframe panel and the associated dies while leaving portions of each leadframe exposed through the mold compound.

The next operation performed is cutting ("singulating" or "dicing") the mold compound blocks that encapsulate each leadframe panel. During singulation, the encapsulated block covering each panel is cut up into multiple smaller blocks. To accomplish this, the leadframe sheet is placed on the top surface of a saw chuck table. A vacuum is applied through holes in the saw chuck table top plate. The vacuum securely holds the leadframe sheet to the saw chuck table top plate as the blocks are sawed along multiple "saw streets" by a rotating saw blade. The saw streets are straight lines arranged in a rectangular grid. The grid rectangles correspond to the individual IC package units in each leadframe panel. Various other plating and lead forming steps are performed on the individual IC packages after singulation.

SUMMARY

A singulation assembly for molded leadframe sheets includes a saw chuck table having a flat upper surface with a plurality of holes therein. A vacuum source is in fluid communication with the plurality of holes. A mechanical clamping assembly operatively associated with the saw chuck table is adapted to be selectively engageable with predetermined portions of a warped molded leadframe sheet supported on the flat upper surface of the saw chuck table.

A method of singulating a warped molded leadframe sheet on a saw chuck table having a support surface includes placing the warped molded leadframe sheet on the support surface and applying vacuum force to the warped molded leadframe sheet through the support surface. The method also includes applying clamping force to the molded leadframe sheet until a vacuum seal is produced between the warped molded leadframe sheet and the support surface.

A method of singulating a plurality of molded leadframe sheets including flat sheets and warped sheets. The method includes placing a molded leadframe sheet on a support surface of a saw chuck table and applying vacuum force to the placed sheet through the support surface. The method also includes determining whether the sheet is flat or warped. The method further includes, in response to a determination that the sheet is warped, applying clamping force to the warped sheet until a vacuum seal is formed between the sheet with the support surface and then removing the clamping force and singulating the molded portions of the sheet. The method also includes, in response to a determination that the sheet is flat, singulating the molded portions of the sheet.

BRIEF DESCRIPTION OF THE DRAWINGS

FIG. 3 is a schematic side elevation view of an encapsulated leadframe sheet supported by the saw chuck table top plate of FIGS. 1 and 2 and showing the leadframe sheet held in place by a vacuum that produces a vacuum seal between the leadframe sheet and the table.

FIG. 4 is a schematic side elevation view of a warped encapsulated leadframe sheet that is supported by a saw chuck table top plate such as shown in FIGS. 1 and 2, wherein no vacuum seal is formed between the sheet and table.

FIG. 5 is a detail side elevation view of the saw chuck table and warped encapsulated leadframe sheet of FIG. 4.

DETAILED DESCRIPTION

Figure 1:
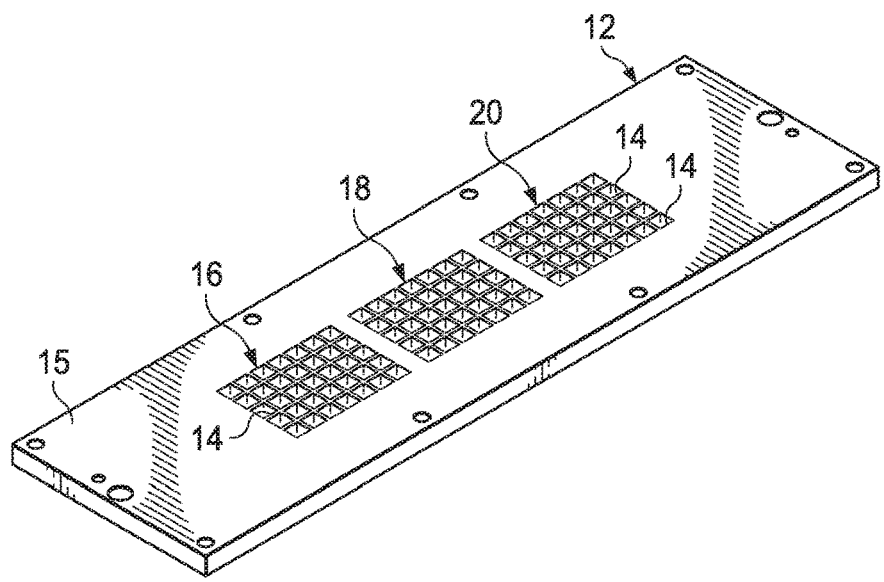
FIG. 1 is an isometric top view of a top plate of a saw chuck table.

FIG. 1 is an isometric view of a top plate 12 of a saw chuck table. A plurality of vacuum holes 14 extend through the top surface 15 of the top plate 12. The plurality of vacuum holes 14 are positioned in separate spaced apart regions 16, 18, 20 of the top plate 12.

Figure 2:
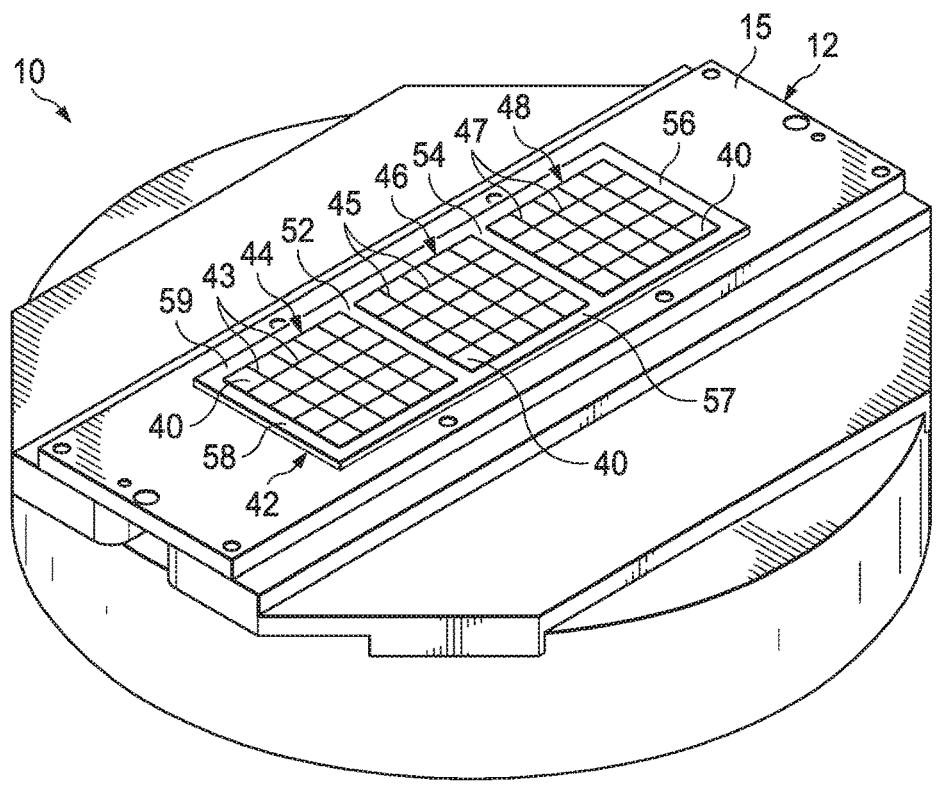
FIG. 2 is an isometric view of a saw chuck table having the top plate shown in FIG. 1 and showing a leadframe sheet with encapsulated leadframe panels supported on the top plate.

FIG. 2 is an isometric view of the saw chuck table 10 having the top plate 12 shown in FIG. 1. An encapsulated leadframe sheet 42 is supported on the top plate 12. The encapsulated leadframe sheet 42 includes a first encapsulated leadframe panel 44, a second encapsulated leadframe panel 46, and a third encapsulated leadframe panel 48. The panels 44, 46, 48, due to their encapsulation in mold compound 40, are somewhat thicker than the non-encapsulated portions. The panels 44, 46, 48 are separated by gaps 52, 54. The position of each panel 44, 46, 48 corresponds to the position of each of the separate vacuum hole containing regions 16, 18, 20, FIG. 1, of the saw chuck table top plate 12. The panels 44, 46, 48 are to be singulated along saw streets 43, 45, 47, etc. that are arranged in a rectangular grid pattern on each panel. By sawing each panel, e.g. panel 44, along its corresponding saw streets, e.g., saw streets 43, each panel is cut into a plurality of rectangular blocks. Each block corresponds to a separate IC package.

As further shown by FIG. 2, the encapsulated leadframe sheet 42, in addition to gaps 52, 54, has peripheral end portions 56, 58 and peripheral side portions 57, 59 that are not encapsulated with mold compound 40. The panels 44, 46, 48, because they are encapsulated with mold compound 40, are somewhat thicker than the non-encapsulated portions 52, 54, 56, 57, 58, 59.

FIG. 3 is a schematic side elevation view of the encapsulated leadframe sheet 42 supported on the top plate 12 of saw chuck table 10. The leadframe sheet 42 is held in place by a vacuum suction/force 11 applied by a vacuum supply source 13 below the plate 12 that is in fluid communication with the vacuum holes 14 in the top plate 12 in regions 16, 18 and 20 (only two representative holes 14 are shown in FIG. 3). The vacuum force 11 is sufficient to hold an encapsulated leadframe sheet 42 in fixed relationship with the top surface 15 of the saw chuck table top plate 12, if the sheet 42 is flat. A vacuum seal is formed around the periphery of the panels 44, 46, 48 of the sheet 42. This vacuum seal prevents the vacuum from leaking and thus maintains a constant holding force on the encapsulated leadframe sheet 42.

FIG. 4 is a schematic side elevation view of a warped encapsulated leadframe sheet 42W that is identical to sheet 42 described above, except that it is warped. In this example embodiment, the end portions 72, 74 of the warped sheet 42W bow upwardly and away from top surface 15 of top plate 12. The vacuum force 17 is not sufficient to overcome the resilient restorative force 19 exerted by the warped end portions 72, 74 of the sheet 42W. In other words, vacuum force 17 in not of sufficient magnitude to downwardly deflect and hold the sheet end portions 72, 74 against the top plate 12. As a result, there is no vacuum seal formed between the sheet 42W and the top surface 15 of the saw chuck table top plate 12. One of the end portions 72 of the sheet 42W where a vacuum leakage 21 occurs is shown in FIG. 5, which is a detail of the right end portion of FIG. 4. (This vacuum leakage 21 is represented in FIG. 5 as an inward airflow and includes the inward airflow at end 74 as well as the inward airflow at end 72.) The vacuum leakage 21 weakens the vacuum force 17 that would have been uniformly applied across the sheet 42W if the vacuum leakage 21 had not occurred. The reduced magnitude of the vacuum force 17 caused by the vacuum leakage 21 prevents the sheet 42W from being stably supported on the saw chuck table 10. This instability interferes with accurate cutting of the panels 44, 46, 48 along the singulation saw streets 43, 45, 47, etc., FIG. 2.

Applicant has overcome the above described problem associated with warped encapsulated leadframe sheets with a saw chuck table having a clamping assembly that supplies sufficient downward force on the warped leadframe sheet to flatten it against the top surface of the saw chuck table. This flattening against the table top enables the formation of a vacuum seal between the table top and the warped sheet. This apparatus and method of operation thereof are described below with reference to FIGS. 6-9.

Figure 6:
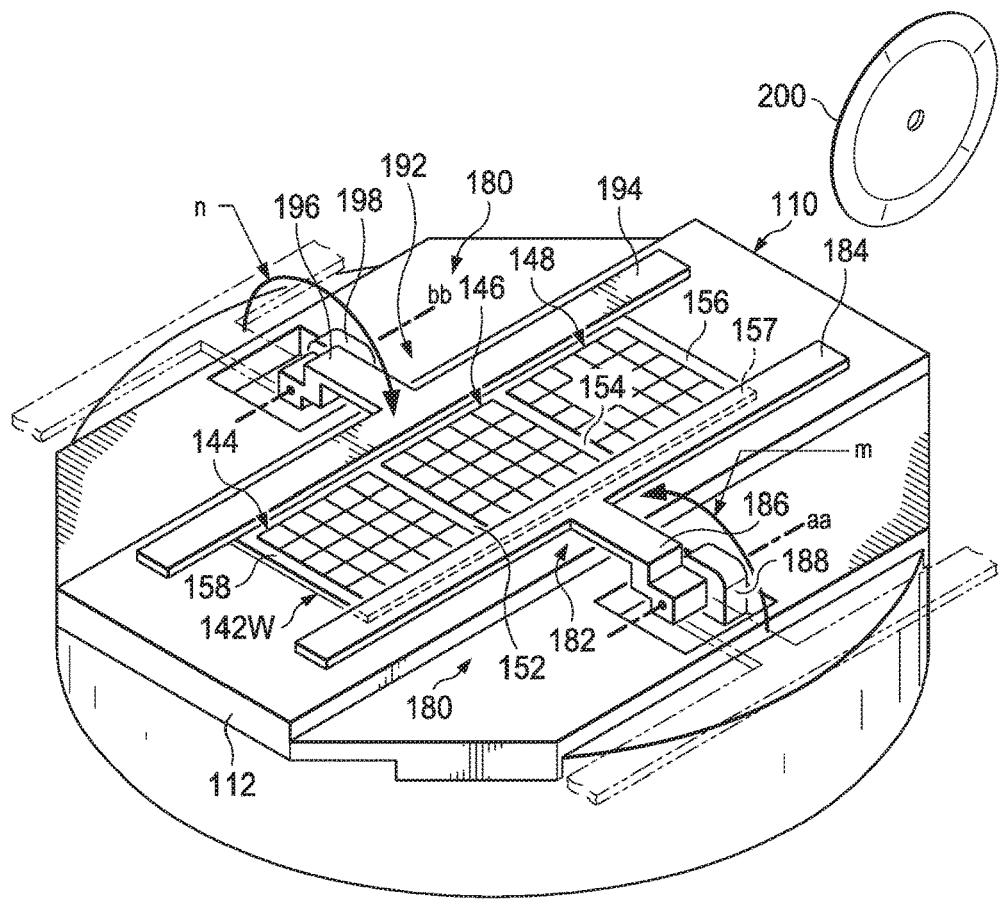
FIG. 6 is a top isometric view of a saw chuck table with a clamping assembly engaging the warped leadframe sheet of FIG. 4.

FIG. 6 is a top isometric view of a saw chuck table 110 with a clamping assembly 180 engaging a warped encapsulated leadframe sheet 142W, which may be identical to the warped encapsulated leadframe sheet 42W described above with reference to FIG. 4. The illustrative example saw chuck table 110, except for the clamping assembly 180 incorporated therein, is identical to saw chuck table 10. The reference numerals used in FIGS. 6 and 7 correspond to those used in FIGS. 4 and 5 above, except that they are 100 series numerals. Since the identical features in FIGS. 4 and 5 have already been described, not all of these features shown with 100 series reference numerals in FIGS. 6 and 7, are again expressly described herein.

Figure 8:
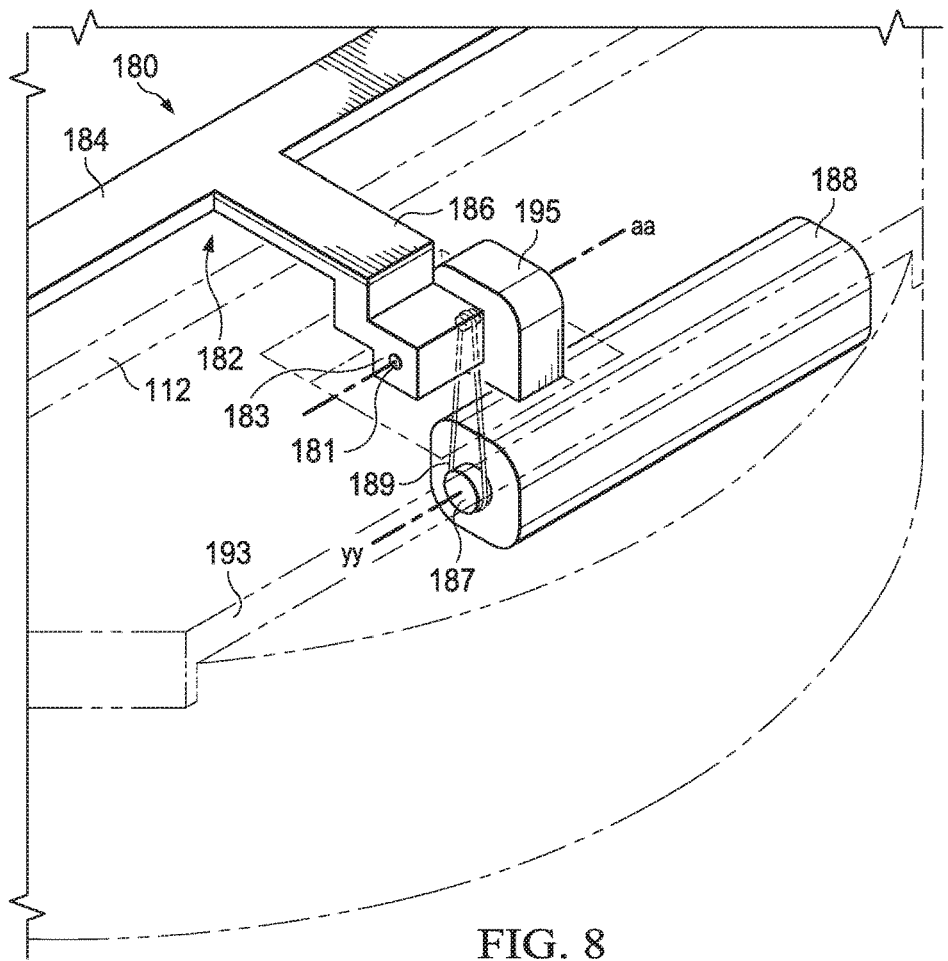
FIG. 8 is a schematic isometric detail view of the clamping assembly of FIG. 6 in a clamped position.
Figure 9:
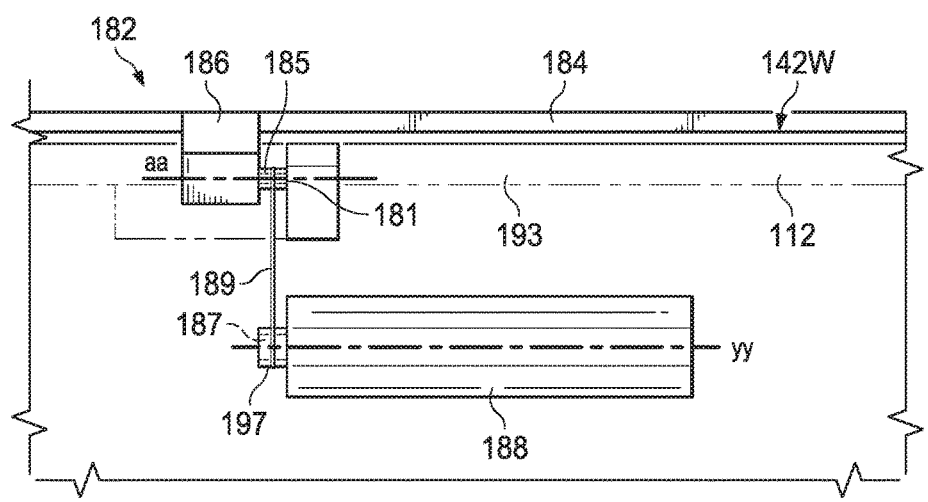
FIG. 9 is a schematic side elevation detail view of the clamping assembly of FIG. 6 in a clamped position.

As shown in FIG. 6, the clamping assembly 180 includes first and second generally T-shaped clamping units 182, 192. Each T-shaped clamping units 182, 192 includes a longitudinal member 184, 194 and a transverse member 186, 196. Each T-shaped clamping units 182, 192 has a rotary operably connected thereto, which provides torque to pivotally displace the associated T-shaped clamping unit 182, 192 about an associated pivot axis aa, bb. (The rotary drivers are not shown in FIG. 8. A driver 188 for clamping unit 182 is shown in FIGS. 6, 8 and 9. A driver 198 and clamping unit 192, shown only in FIG. 6, may be a mirror image of the driver 188 and clamping unit 182.) The direction in which clamping torque is applied to clamp the associated unit 182, 192 against a warped encapsulated leadframe sheet 142W is indicated at "m" and "n" in FIG. 6. Each clamping unit 182, 192 has a clamped position in which it applies clamping force to a warped, encapsulated leadframe, e.g., 142W, as shown in solid lines in FIG. 6. Each clamping unit 182, 192 also has an open position, which may be pivoted about 180° from the clamped position, as shown in dashed lines in FIG. 6. In the open position, the clamping units 182, 192 are positioned in noninterfering relationship with an associated singulation saw 200 used to singulate the encapsulated panels 144, 146, 148.

Figure 7:
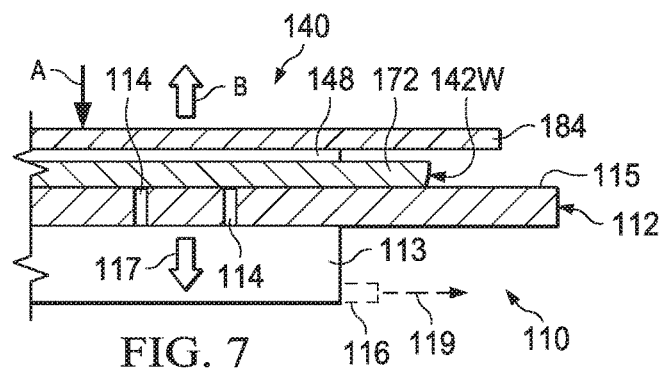
FIG. 7 is a side elevation detail view of the saw chuck table of FIG. 6 and a warped end portion of the encapsulated leadframe sheet, wherein the leadframe sheet is engaged by the clamping assembly.

The structure and operation of clamping unit 182 will now be described in further detail. (The structure and operation of clamping unit 192 may be essentially identical to that of unit 182, and thus will not be further described.) The torque applied by driver 188 moves T-shaped clamping unit 182 from a resting position through an arcuate path m of about 180° into contact with an unencapsulated (unmolded) longitudinal edge portion 157 of sheet 142W. (Edge portion 157 corresponds to unencapsulated longitudinal edge portion 57 of the encapsulated leadframe sheet 42 shown in FIG. 2.) Once the T-shaped clamping unit 182 is engaged with edge portion 157, the driver 188 applies a predetermined torque which applies a predetermined force A against the sheet 182. The force A is illustrated in FIG. 7, which is a detail cross-sectional elevation view of one of the warped end portions 172 of the encapsulated leadframe sheet 142W. As best shown by FIG. 7, the downward force A applied by the T-shaped clamping unit 182, in combination with the force 117 applied by the vacuum unit 113 is sufficient to overcome the resilient restorative force B of the warped sheet 142W so that the leadframe sheet end portion 172 is pressed flat against the top surface 115 of the saw chuck table to plate 112. With the leadframe sheet 142W thus pressed flat against the top surface of plate 112, a vacuum seal is formed. In one embodiment, the force 117 applied by the vacuum source 113 is sufficiently great so that once a vacuum seal is formed, the force 117 is sufficient to hold the sheet 142W stably in place after the clamping force is A is removed. Thus, once a vacuum seal has been formed, the clamping unit 182 is displaced in a direction opposite to direction m, back to its resting position where it does not interfere with the upcoming sawing operation.

FIG. 8 is a schematic isometric detail view of the clamping assembly of FIG. 6 in a clamped position, and FIG. 9 is a schematic side elevation detail view of the clamping assembly of FIG. 6 in a clamped position. As shown by FIGS. 8 and 9, a driver 188, which in one embodiment is an electric stepper motor, has a drive shaft 187 with a rotation axis yy. This driver 188 may be positioned below and fixedly mounted with respect to top plate 112. Driver 188 is also positioned below a support plate 193 that is fixedly mounted with respect to top plate 112. Transverse member 186 of the T-shaped clamping unit 182 has a shaft 181 coaxial with the axis of rotation aa. The shaft 181 is fixedly mounted in one end portion 183 of the transverse member 186. The shaft 181 is rotatably supported, as by bearings (not shown) in a vertical member 195, which may be attached to or integral with support plate 193, enabling rotation of shaft 181 about axis aa. A gear or pulley 185 is fixedly mounted on shaft 181. A corresponding gear or pulley 197 is mounted on drive shaft 187 and a chain or drive belt 189 drivingly connects the two gears/pulleys 181, 197. Thus torque from the driver 188 is transmitted to the clamping unit 182 causing rotational displacement thereof and application of clamping force to the warped leadframe sheet as discussed above.

In one example embodiment, the clamping operation is initiated by an operator, as by flipping a power switch for the drivers, after observing that the applied vacuum has not adequately flattened the leadframe sheet 142W. In a variation of this embodiment, the operator may measure the amount of warp and if the measurement(s) exceed a preset amount the drivers are actuated. The amount of warp in a leadframe sheet may be measured based upon the warp in each panel, known as the "block warp," as well as the amount of warp in the entire sheet, known as "strip warp." With reference to FIG. 3, the amount of block warp in panel 44 is the difference in height of the panel 44 measured at its centerline A and at a longitudinal edge B, prior to application of vacuum force 11. The strip warp is the difference in height measured at the centerline C of the leadframe sheet 10 in FIG. 3, and the height at one longitudinal edge, e.g., E, of an outer panel, e.g., 48 of sheet 10. In each case "height" refers to the distance of the subject surface portion of the sheet 10 above the top surface 15 of the chuck table 12 or other horizontal support surface. In one example embodiment, the amount of measured warp must exceed 3 mm of strip warp or 0.80 mm of block warp for the leadframe sheet to be considered sufficiently warped to actuate the clamping unit 182, 192.

In another example embodiment, as shown in dashed lines in FIG. 7, a vacuum sensor 116 that is operatively associated with the vacuum unit 113 and generates a signal 119 when the vacuum force remains below a predetermined value for a preset time period after the leadframe sheet 142W has been loaded. In a variation of this embodiment, the vacuum force is measured a predetermined period of time after the leadframe sheet has been loaded. That predetermined period of time may be based upon the length of time that it ordinarily takes for the vacuum force to engage and hold a flat sheet against the chuck table 110. In either case, this signal 119 generated based upon measured vacuum force is used to actuate the clamping unit drivers, 188, etc., to displace the clamping units 182, 192. In yet another example embodiment, the manner in which clamping unit displacement is initiated is a selectable feature. It may be done manually by the operator in a manual operating mode, or it may be done automatically based upon monitored vacuum force in an automatic operating mode. Since the clamping units 182, 192 are not actuated for flat sheets, both flat sheets and warped sheets may be received and operated on at the same saw chuck table 110. Thus, presorting of the warped and unwarped sheets is unnecessary.

Figures 10, 11:
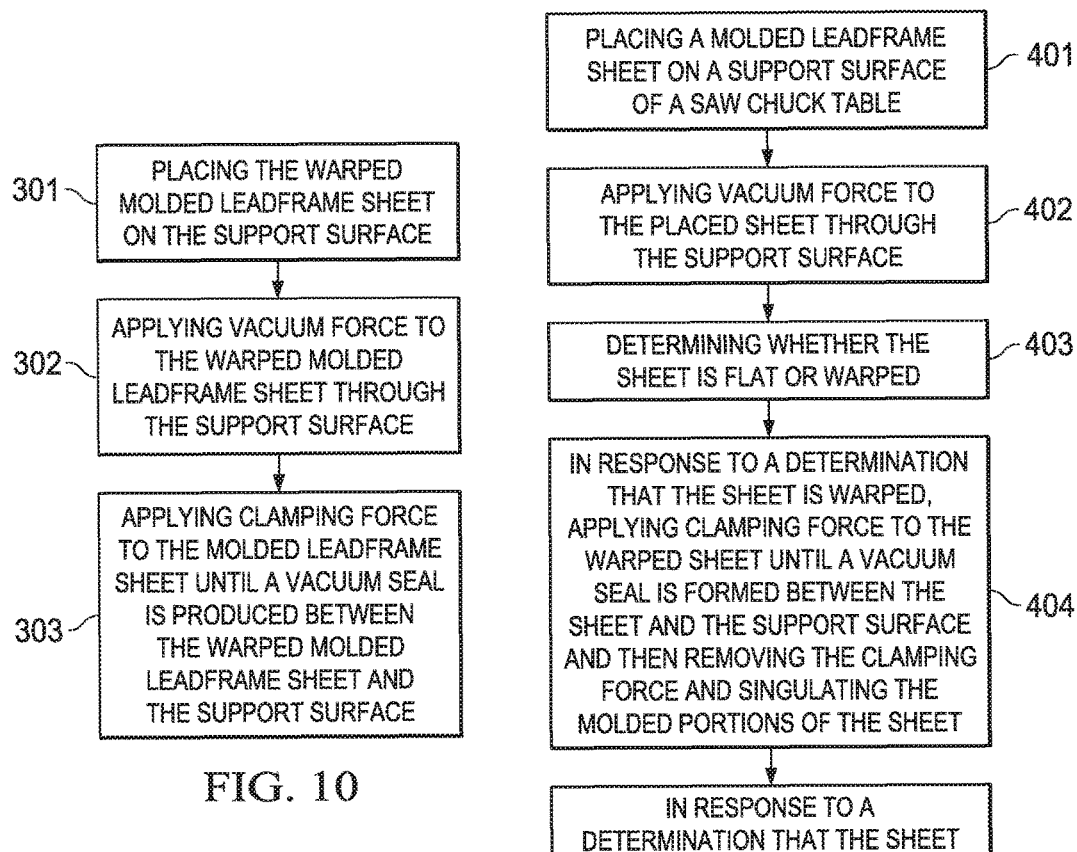
FIG. 10 is a flowchart of a method of singulating a warped molded leadframe sheet on a saw chuck table having a top support surface.
FIG. 11 if a flowchart of a method of singulating a plurality of molded leadframe sheets comprising flat sheets and warped sheets.

FIG. 10 is a flowchart of a method of singulating a warped molded leadframe sheet on a saw chuck table having a top support surface. The method includes placing the warped molded leadframe sheet on the support surface, as indicated in block 301. The method also includes, as shown at block 302, applying vacuum force to the warped molded leadframe sheet through the support surface. The method further includes, as shown at block 303, applying clamping force to the molded leadframe sheet until a vacuum seal is produced between the warped molded leadframe sheet and the support surface.

FIG. 11 is a flowchart of a method of singulating a plurality of molded leadframe sheets comprising flat sheets and warped sheets. The method includes, as shown at block 401, placing a molded leadframe sheet on a support surface of a saw chuck table. The method also includes, as shown at block 402, applying vacuum force to the placed sheet through the support surface. The method further includes, as shown at block 403, determining whether the sheet is flat or warped. The method further includes, in response to a determination that the sheet is warped, applying clamping force to the warped sheet until a vacuum seal is formed between the sheet and the support surface and then removing the clamping force and singulating the molded portions of the sheet, as shown at block 404. The method still further includes, in response to a determination that the sheet is flat, singulating the molded portions of the sheet, as shown at block 405.

A saw chuck table assembly for stably supporting an encapsulated leadframe assembly that is subject to warping and associated methods of operation thereof have been expressly described in detail herein. Alternative embodiments of this assembly and method may occur to those skilled in the art after reading this disclosure. It is intended that the claim language be broadly construed so as to cover all such alternative embodiments, except insofar as limited by the prior art.

What is claimed is:

1. A method of singulating a plurality of molded leadframe sheets comprising flat sheets and warped sheets comprising:
   placing a molded leadframe sheet on a support surface of a saw chuck table;
   applying vacuum force to the sheet through the support surface;
   determining whether the sheet is flat or warped;
   in response to a determination that the sheet is warped, applying clamping force to the sheet until a vacuum seal is formed between the sheet with the support surface and then removing the clamping force; and
   singulating the molded portions of the sheet.

2. The method of claim 1 further comprising repeating the method for each of the plurality of molded leadframe sheets.

3. The method of claim 1 wherein applying clamping force to the sheet comprises pivotally moving a clamping unit into engaged relationship with an unmolded edge portion of the sheet and wherein removing the clamping force comprises pivotally moving the clamping unit to a position in noninterfering relationship with a singulation saw operatively associated with the saw chuck table.

4. The method of claim 1 wherein applying clamping force to the sheet comprises pivotally moving a T-shaped clamping unit into engaged relationship with the unmolded edge portion of the sheet.

5. The method of claim 1 wherein determining whether the sheet is flat or warped is performed by measuring the applied vacuum force.

6. A method comprising:
   attaching integrated circuit dies to a leadframe sheet;
   electrically connecting the integrated circuit dies to the leadframe sheet;

molding portions of the leadframe sheet to create a molded leadframe sheet;

placing the molded leadframe sheet on a support surface of a saw chuck table;

applying vacuum force to the placed sheet through the support surface;

determining whether the molded leadframe sheet is warped;

in response to a determination that the sheet is warped, applying clamping force to the molded leadframe sheet until a vacuum seal is formed between the molded leadframe sheet with the support surface;

applying clamping force to the molded leadframe sheet until a vacuum seal is formed between the molded leadframe sheet with the support surface and then removing the clamping force and singulating the molded portions of the sheet; and singulating the molded portions of the molded leadframe sheet.

7. The method of claim 6 wherein applying clamping force to the molded leadframe sheet comprises pivotally moving a clamping unit into engaged relationship with an unmolded edge portion of the molded leadframe sheet and wherein removing the clamping force comprises pivotally moving the clamping unit to a position in noninterfering relationship with a singulation saw operatively associated with the saw chuck table.

8. The method of claim 6 wherein applying clamping force to the molded leadframe sheet comprises pivotally moving a T-shaped clamping unit into engaged relationship with the unmolded edge portion of the molded leadframe sheet.

9. The method of claim 6 wherein determining whether the molded leadframe sheet is flat or warped is performed by measuring the applied vacuum force.

* * * * *